(12) United States Patent
Rohrer et al.

(10) Patent No.: US 8,693,195 B2
(45) Date of Patent: Apr. 8, 2014

(54) CHASSIS APPARATUS PROTRUDING ELECTRONIC DEVICES

(75) Inventors: David G. Rohrer, Aubrun, CA (US); Glenn C. Simon, Auburn, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 87 days.

(21) Appl. No.: 13/460,991

(22) Filed: May 1, 2012

(65) Prior Publication Data

US 2013/0293075 A1   Nov. 7, 2013

(51) Int. Cl.
*H05K 7/20* (2006.01)
(52) U.S. Cl.
USPC .......................................... 361/695; 361/694
(58) Field of Classification Search
None
See application file for complete search history.

(56) References Cited

U.S. PATENT DOCUMENTS

| | | | | | |
|---|---|---|---|---|---|
| 4,744,005 | A | * | 5/1988 | Milani | 361/679.48 |
| 5,493,473 | A | * | 2/1996 | Yanagi | 361/695 |
| 5,560,410 | A | * | 10/1996 | Peacock | 144/362 |
| 6,081,422 | A | * | 6/2000 | Ganthier et al. | 361/679.22 |
| 6,122,173 | A | * | 9/2000 | Felcman et al. | 361/726 |
| 6,473,297 | B1 | * | 10/2002 | Behl et al. | 361/679.48 |
| 6,542,362 | B2 | | 4/2003 | Lajara et al. | |
| 6,574,100 | B1 | | 6/2003 | Anderson | |
| 7,177,157 | B2 | * | 2/2007 | Aronson et al. | 361/727 |
| 7,210,586 | B2 | * | 5/2007 | Ice | 211/26 |
| 7,679,920 | B2 | | 3/2010 | Musciano et al. | |
| 7,865,326 | B2 | * | 1/2011 | Johnson et al. | 702/127 |
| 8,120,912 | B2 | | 2/2012 | Aybay et al. | |
| 8,325,488 | B2 | * | 12/2012 | Nichols et al. | 361/756 |
| 8,351,204 | B2 | * | 1/2013 | Yeo et al. | 361/695 |
| 2010/0110632 | A1 | | 5/2010 | Rose et al. | |
| 2011/0292602 | A1 | | 12/2011 | Narasimhan et al. | |

* cited by examiner

*Primary Examiner* — Gregory Thompson

(57) ABSTRACT

An apparatus includes a chassis that further includes at least one receiving buttress. The chassis defines an enclosure, and the at least one buttress protrudes a portion of a first electronic device outside the enclosure by preventing further insertion of the first electronic device into the enclosure.

20 Claims, 2 Drawing Sheets

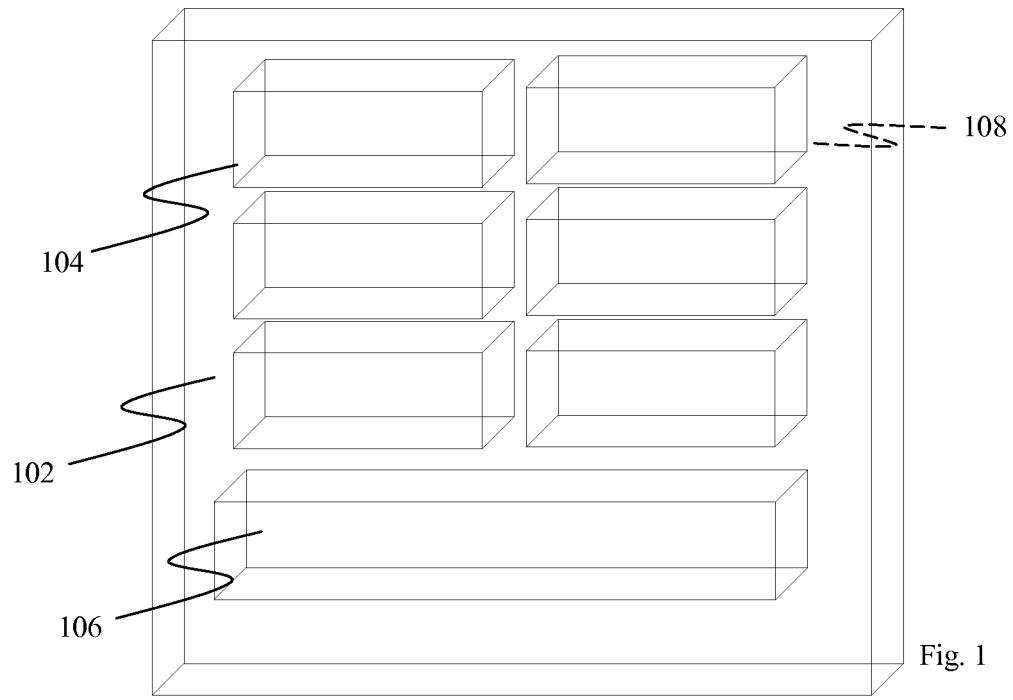
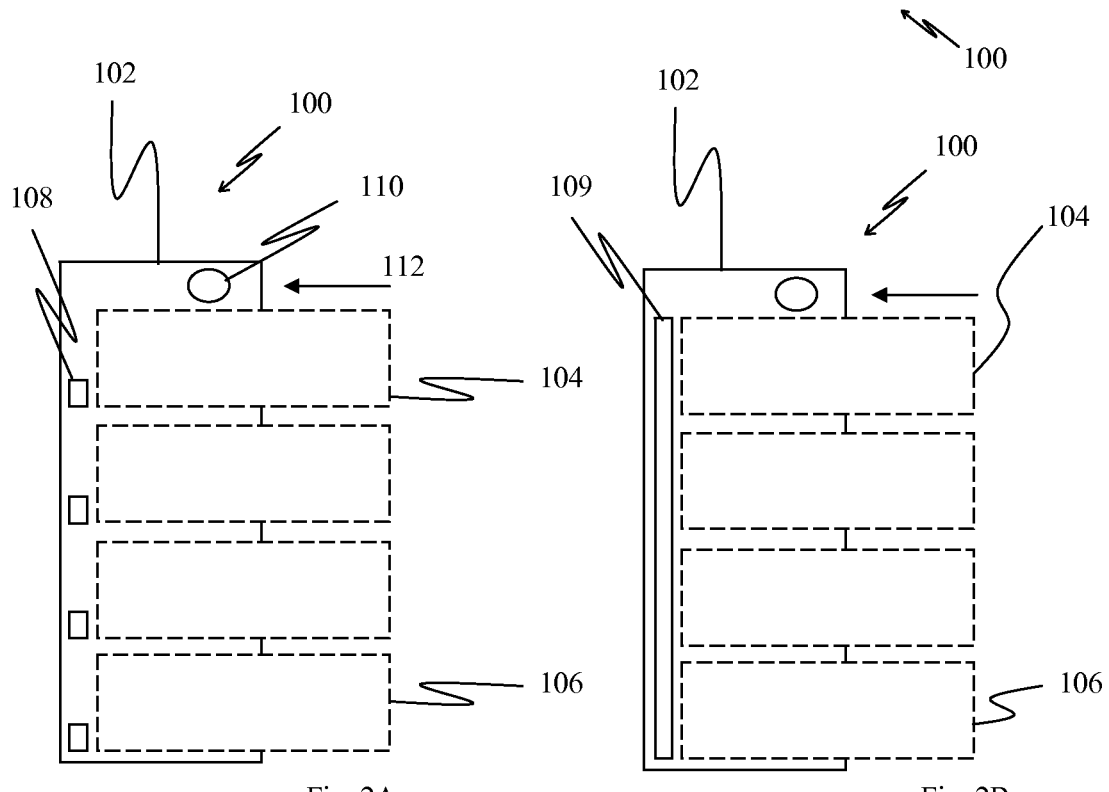

CHASSIS APPARATUS PROTRUDING ELECTRONIC DEVICES

BACKGROUND

Chassis for electronic devices have a crowded front-panel area due to the space required for network cable connectors. In order to mitigate the crowding, some chassis designers have placed fans on the sides of the chassis. In such systems, cooling air flows from side-to-side when viewing the chassis from the front. Heat from each electronic device transfers to the cooling air as the air flows over each such electronic device along the air flow path.

BRIEF DESCRIPTION OF THE DRAWINGS

For a detailed description of various examples of the invention, reference will now be made to the accompanying drawings in which:

FIG. 1 illustrates a perspective view of a chassis with electronic devices installed in accordance with at least some examples;

FIGS. 2A and 2B illustrate a side view of the chassis in accordance with at least some examples;

DETAILED DESCRIPTION

Figures 3A, 4A:
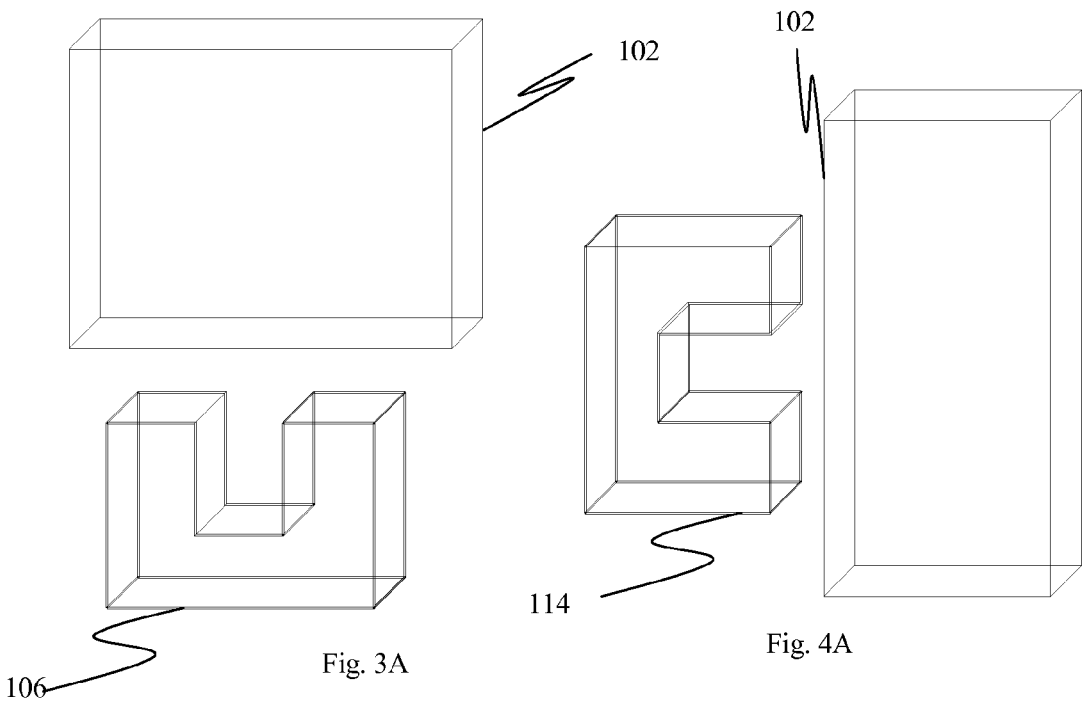
FIGS. 3A and 3B show top views of the chassis and a double-wide electronic device in accordance with at least some examples.
FIGS. 4A and 4B show side views of the chassis and a double-high electronic device in accordance with at least some examples.

Because computing elements are side-by-side themselves, air heated by a first electronic device passes over an adjacent electronic device resulting in inefficient cooling of the adjacent electronic device. The electronic devices in a chassis may be cooled efficiently by a receiving buttress causing the electronic devices to protrude from the chassis. By protruding the computing elements to air outside the enclosure, beneficial ventilation is passively increased. Furthermore, fans directing air from the front of the chassis to the back of the chassis actively increases beneficial ventilation. Additionally, the protrusion of the electronic devices also mitigates the crowding of the front-panel area.

A chassis may comprise a standardized frame for mounting multiple electronic devices. For example, a chassis may comprise a 19 inch chassis or 23 inch chassis, and the electronic device slots may be multiples of 1.75 inches tall or 1 rack unit ("U"). Although a rack unit is a convenient unit of measurement, any chassis disclosed herein is not limited in slot or housing dimensions. The chassis may include two or four vertical posts for mounting rails, and the posts may support the electronic devices at the front of the chassis, rear of the chassis, or both. The posts may include holes for fastening screws to support the electronic devices in the chassis. Other support fasteners may also be used.

FIG. 1 illustrates a perspective view of a system 100 including a chassis 102 in accordance with at least some examples. As depicted, the chassis 102 includes two columns of slots with four rows in each column. The electronic devices 104 may comprise switches, other networking elements, data processor devices, data storage devices, servers, blades, etc. The electronic devices 104 may use rails on the chassis 102 for ease of insertion into the chassis 102. The electronic devices 104 may be slightly smaller than the corresponding multiples of U of the slot in which the electronic devices 104 will be installed for ease of insertion as well. In at least one example, the chassis may include slots used to receive the electronic devices, and no slot is left unused for ventilation. By protruding the electronic devices 104, space may be used effectively in the chassis 102 without a tradeoff for ventilation. The portions of the electronic devices protrude on a receiving face of the chassis 102 in at least one example. These portions, or the entirety of the electronic devices 104, may include ventilation openings on any or all sides of the electronic devices 104. The ventilation openings may increase the cooling effect of the passing air. As such, the chassis 102 may use fewer resources for cooling than current chassis such as fewer fans, less power, etc. Furthermore, in addition to the fewer resources used, space may be gained inside the chassis for additional hardware. For example, the space saved by having fewer fans may be devoted to other hardware.

The electronic devices 104 may be double-wide in size as depicted at electronic device 106 or may be double high in size. For example, one electronic device 104 may fill two adjacent slots horizontally or vertically as will be discussed below. Additionally, in some examples, the slots may not be adjacent.

In at least one embodiment, the chassis 102 may comprise at least one backplane. A backplane may include at least one circuit board with several connectors forming a computer bus. In at least one example, the chassis 102 may include at least one buttressing element 108, which is obscured in FIG. 1, as a fixed part of the chassis 102 or as an element removably coupled to the chassis 102.

FIGS. 2A and 2B illustrate a transparent side view of the chassis 102 in accordance with at least some examples. The chassis 102 may define an enclosure within the chassis, depicted as within the rectangle 102. The chassis 102 may include receiving buttresses 108 within the enclosure such that the buttresses protrude a portion of each of the electronic devices 104 when fully installed and operational in the chassis 102. The electronic devices 104 protrude outside the enclosure because they are prevented from being inserted further into the enclosure by the receiving buttresses 108. In at least one example, the receiving buttresses 108 may include blocking rails. As such, the electronic devices 104 may physically rest against the receiving buttresses 108 while being blocked from further insertion into the enclosure. In at least one other example, the receiving buttresses 108 may include mechanical fasteners. For example, the receiving buttresses 108 may include rivets that fit into depressions on the electronic devices 104. The receiving buttresses may include hooks or latches that latch on the electronic devices 104 in another embodiment. In this way, mechanical fasteners hold the electronic devices 104 in place and prevent further insertion into the enclosure. In at least one other example, the receiving buttresses 108 may include adhesives such as glue, tape, or items with similar chemical compounds to prevent further insertion of the electronic devices 104 into the enclosure by adhesion.

The chassis may include at least one fan 110 that directs air in the direction from protruded portions of the electronic devices toward non-protruded portions of the electronic devices. For example, the air is directed in the direction of arrow 112 such that air heated by one electronic device 104 does not pass over or under another electronic device 104. The fan 110 may be fixed to the chassis 102 or removably coupled to the chassis 102. In various examples, the electronic devices 104 or only the protruded portions of the electronic devices 104 may comprise ventilation openings for greater access to cooling air. In at least one example, these ventilation openings may be such that cooling air is forced in the direction of arrow 112.

As depicted in FIG. 2A, there is one receiving buttress 108 per slot or per electronic device 104. However, there may be one receiving buttress 108 per column, row, or for the entire chassis 102 in various examples. For example, FIG. 2B depicts a receiving buttress 109 removably coupled to the chassis 102. Such a removable buttress 109 may be useful for converting chassis from which the electronic devices do not protrude into chassis 102 from which the electronic devices 104 protrude. Such a receiving buttress 109 may include holes for connectors or cables to pass through to allow the electronic devices 104 access to the backplane. In additional to saving resources previously used for cooling, the chassis 102 may increase the lifespan of the electronic devices 104 because passive cooling methods are highly unlikely to fail when compared with active cooling methods.

Figures 3B, 4B:
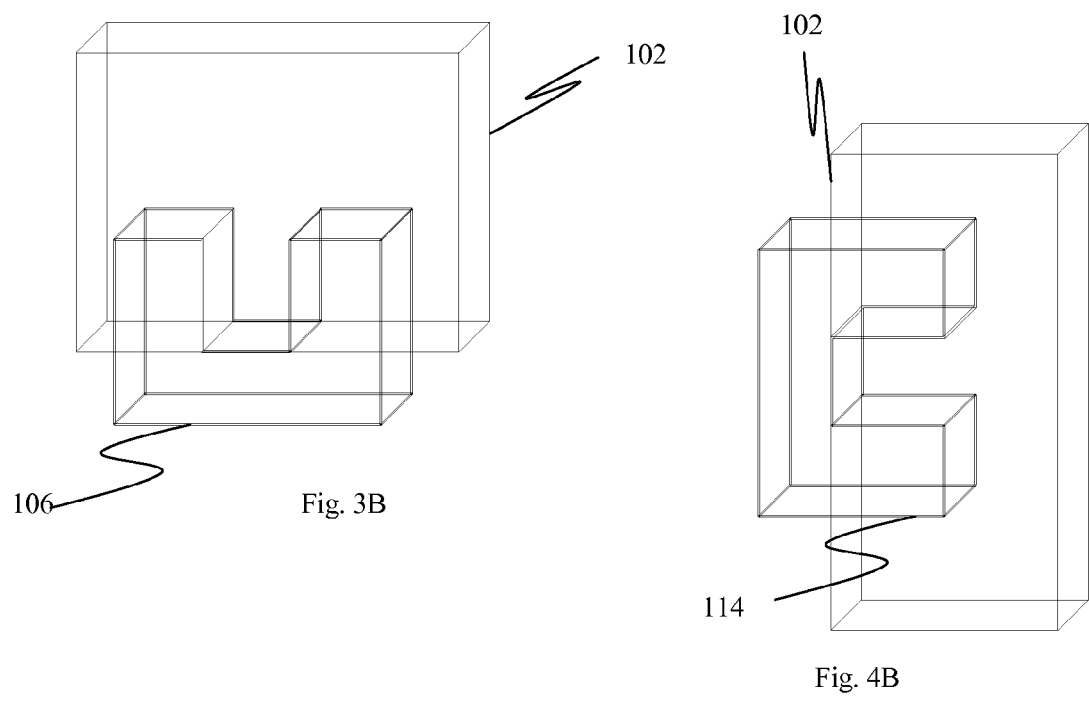

FIGS. 3A and 3B show top views of the chassis 102 and a double-wide electronic device 106 in accordance with at least some examples, and FIGS. 4A and 4B show side views of the chassis 102 and a double-high electronic device 114 in accordance with at least some examples. Specifically, FIG. 3A illustrates the chassis 102 including at least two columns of slots used to receive electronic devices. One of the electronic devices 106 may be received by two slots, one slot in each column. Such a "u-shaped" electronic device 106 may be contiguous outside the enclosure and noncontiguous inside the enclosure when fully installed and operational as shown in FIG. 3B. Such a electronic device 106 may be referred to as a double-wide electronic device. In at least one example, twenty percent of the device depth protrudes from the chassis 102, and eighty percent of the device depth resides within the enclosure when fully installed. In another example, a majority of the device depth resides within the enclosure when fully installed, and less than a majority of the device depth protrudes from the chassis 102.

Turning to FIG. 4A, the chassis 102 may include at least two rows of slots used to receive electronic devices. At least one electronic device 114 may be received by two slots, one slot in each row. Such an ("e-shaped") electronic device 114 may be contiguous outside the enclosure and noncontiguous inside the enclosure when fully installed and operational as shown in FIG. 4B. Such a electronic device 114 may be referred to as a double-high electronic device. In at least some examples, the electronic devices 106, 114 skip one or more slots between the slots they fill. The u-shaped and e-shaped devices may also benefit from passive cooling via protruding from the chassis and air flow directed from the front of the chassis to the rear of the chassis.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An apparatus, comprising:
a chassis comprising an enclosure; and
a receiving buttress disposed within the enclosure;
wherein the chassis is configured to receive a first electronic device within the enclosure;
wherein the receiving buttress is configured to limit insertion of the first electronic device into the enclosure such that, when inserted, a protruded portion of the first electronic device protrudes outside the enclosure and a remainder of the first electronic device is fully enclosed within the enclosure when the first electronic device is fully installed within the enclosure.

2. The apparatus of claim 1, wherein the chassis comprises a fan that directs air from the protruded portions of the first electronic device toward the remainder of the first electronic device.

3. The apparatus of claim 1, wherein the chassis further comprises:
at least two columns of slots disposed within the enclosure;
wherein a second electronic device is configured to be received by a first pair of slots of the at least two columns of slots;
wherein each slot of the first pair of slots is in a different column of the at least two columns;
wherein when the second electronic device is fully received by the first pair of slots, a protruded portion protrudes outside the enclosure and a remainder is fully enclosed within the enclosure; and
wherein the protruded portion of the second electronic device is contiguous and the remainder of the second electronic device is noncontiguous.

4. The apparatus of claim 1, wherein the chassis further comprises:
at least two rows of slots disposed within the enclosure;
wherein a second electronic device is received a first pair of slots of the at least two rows;
wherein each slot of the first pair of slots is in a different row of the at least two rows;
wherein when the second electronic device is fully received by the first pair of slots, a protruded portion protrudes outside the enclosure and a remainder of the electronic device is fully enclosed within the enclosure; and
wherein the protruded portion of the second electronics device is contiguous and the remainder is noncontiguous.

5. The apparatus of claim 1, wherein the chassis comprises a plurality of slots each configured to receive the first electronic device, and wherein no slot is left unused for ventilation.

6. The apparatus of claim 1, wherein the protruded portion of the first electronic device protrudes on a receiving face of the chassis.

7. The apparatus of claim 1, wherein the first electronic device comprises a switch.

8. The apparatus of claim 1, wherein the receiving buttress comprises a blocking rail.

9. The apparatus of claim 1, wherein the receiving buttress comprises a mechanical fastener.

10. The apparatus of claim 1, wherein the receiving buttress comprises an adhesive.

11. The apparatus of claim 1, wherein the protruded portion of the first electronic device comprises ventilation openings.

12. A system, comprising:
a chassis comprising an enclosure;
a receiving buttresses, removably coupled to the chassis;
a plurality of electronic devices each configured to be installed within the enclosure of the chassis;
wherein the receiving buttress is configured to protrude a protruded portion of a first electronic device of the plurality of electronic devices outside the enclosure such that a remainder of the first electronic device is fully enclosed within the enclosure when the plurality of electronic devices are installed in the enclosure by preventing further insertion of the first electronic device into the enclosure.

13. The system of claim 12, further comprising a fan that directs air in the direction from the protruded portion of the first electronic device toward the remainder of the first electronic device.

14. The system of claim 12, wherein the chassis further comprises:
at least two columns of slots disposed within the enclosure;
wherein a second electronic device of the plurality of electronic devices is received by a first pair of slots of the at least two columns of slots;
wherein each slot of the first pair of slots is in a different column of the at least two columns;
wherein when the second electronic device is fully received within the first pair of slots, a protruded portion of the second electronic device protrudes from the enclosure and a remainder of the second electronic device is fully enclosed within the enclosure; and
wherein the protruded portion of the second electronic device is contiguous and the remainder of the second electronic device is noncontiguous.

15. The system of claim 12, wherein the chassis further comprises:
at least two rows of slots disposed within the enclosure;
wherein a second electronic device of the plurality of electronic devices is received by a first pair of slots of the at least two rows of slots;
wherein each slot of the first pair of slots is in a different row of the at least two rows of slots;
wherein when the second electronic device is fully received within the first pair of slots, a protruded portion of the second electronic device protrudes from the enclosure and a remainder of the second electronic device is fully enclosed within the enclosure; and
wherein the protruded portion of the second electronic device is contiguous and the remainder of the second electronic device is noncontiguous.

16. The system of claim 12, wherein the chassis comprises a plurality of slots each configured to receive one of the plurality of electronic devices, and wherein none of the plurality of slots is left unused for ventilation.

17. The system of claim 12, wherein the protruded portion of the first electronic device protrudes from a receiving face of the chassis.

18. The system of claim 12, wherein the protruded portion of the first electronic device of the plurality of electronic devices comprises ventilation openings.

19. The apparatus of claim 1, wherein the first electronic device includes a depth, and wherein the protruded portion comprises twenty percent of the depth of the first electronic device and the remainder comprises eighty percent of the depth of the first electronic device.

20. The system of claim 12, wherein the first electronic device includes a depth, and wherein the protruded portion comprises twenty percent of the depth of the first electronic device and the remainder comprises eighty percent of the depth of the first electronic device.

* * * * *